United States Patent
Hyuseinova et al.

(10) Patent No.: US 9,262,336 B2
(45) Date of Patent: Feb. 16, 2016

(54) PAGE MISS HANDLER INCLUDING WEAR LEVELING LOGIC

(75) Inventors: Nevin Hyuseinova, Barcelona (ES); Qiong Cai, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 164 days.

(21) Appl. No.: 13/995,464

(22) PCT Filed: Dec. 23, 2011

(86) PCT No.: PCT/US2011/067221
§ 371 (c)(1),
(2), (4) Date: Jun. 18, 2013

(87) PCT Pub. No.: WO2013/095644
PCT Pub. Date: Jun. 27, 2013

(65) Prior Publication Data
US 2014/0201495 A1    Jul. 17, 2014

(51) Int. Cl.
*G06F 12/10* (2006.01)
*G11C 16/34* (2006.01)
*G06F 12/02* (2006.01)

(52) U.S. Cl.
CPC ........ *G06F 12/1027* (2013.01); *G06F 12/1009* (2013.01); *G11C 16/3495* (2013.01); *G06F 12/0246* (2013.01); *G06F 2212/202* (2013.01); *G06F 2212/7211* (2013.01)

(58) Field of Classification Search
CPC . G06F 10/10; G06F 10/1009; G06F 10/1027; G06F 10/0292; G06F 12/0246; G06F 2212/7211; G06F 2212/7201; G06F 2212/7205; G06F 2212/7208; G06F 2212/1036; G06F 2212/7202; G06F 3/061; G06F 3/064; G11C 16/349; G11C 16/3495
See application file for complete search history.

(56) References Cited

U.S. PATENT DOCUMENTS

| | | | |
|---|---|---|---|
| 5,485,595 A | 1/1996 | Assar et al. | |
| 6,490,665 B1 * | 12/2002 | Lai et al. | 711/160 |
| 6,715,057 B1 | 3/2004 | Kessler et al. | |
| 6,775,747 B2 * | 8/2004 | Venkatraman | 711/137 |

(Continued)

OTHER PUBLICATIONS

PCT International Search Report for PCT Counterpart Application No. PCT/US2011/067221, 8 pgs., (Sep. 21, 2012).
PCT Written Opinion of the International Searching Authority for PCT Counterpart Application No. PCT/US2011/067221, 3 pgs., (Sep. 21, 2012).

(Continued)

*Primary Examiner* — Mark Giardino, Jr.
*Assistant Examiner* — Rocio Del Mar Perez-Velez
(74) *Attorney, Agent, or Firm* — Nicholson De Vos Webster & Elliott LLP

(57) ABSTRACT

Embodiments of the invention describe an apparatus, system and method for utilizing a page miss handler having wear leveling logic/modules for memory devices. Embodiments of the invention may track an amount of writes directed towards cells of a memory device, and determine whether a linear address specified by a system write transaction is included in a translation-lookaside buffer (TLB). In response to determining the linear address is not included in the TLB, resulting in a TLB miss, embodiments of the invention may perform a page table walk to obtain a corresponding physical address, and convert the physical address to a device address for accessing the memory device based the tracked amount of writes. Thus, embodiments of the invention are more efficient compared to prior art solutions, as instead of all memory operations, only those that miss in the TLB incur additional wear leveling address translation overhead.

21 Claims, 13 Drawing Sheets

(56) References Cited

U.S. PATENT DOCUMENTS

| | | |
|---|---|---|
| 6,801,994 B2 | 10/2004 | Beckert et al. |
| 7,409,490 B2 | 8/2008 | Liu |
| 7,669,011 B2 | 2/2010 | Conway |
| 8,103,821 B2 | 1/2012 | Chang et al. |
| 8,108,590 B2 | 1/2012 | Chow et al. |
| 2002/0116588 A1* | 8/2002 | Beckert et al. ............... 711/161 |
| 2004/0268071 A1* | 12/2004 | Khan et al. .................. 711/163 |
| 2008/0219053 A1 | 9/2008 | Kim |
| 2008/0313505 A1 | 12/2008 | Lee et al. |
| 2009/0138654 A1* | 5/2009 | Sutardja ..................... 711/103 |
| 2009/0172344 A1* | 7/2009 | Grochowski et al. ......... 711/207 |
| 2011/0302359 A1 | 12/2011 | Schmidberger |
| 2012/0079232 A1* | 3/2012 | Hinton et al. ................ 711/207 |
| 2013/0166827 A1 | 6/2013 | Cideciyan et al. |
| 2013/0282967 A1 | 10/2013 | Ramanujan |

OTHER PUBLICATIONS

PCT Notification concerning Transmittal of International Preliminary Report on Patentability (Chapter I of the Patent Cooperation Treaty) for PCT Counterpart Application No. PCT/US2011/067221, 5 pgs., (Jul. 3, 2014).

PCT International Search Report for PCT Application No. PCT/US2011/067218, 3 pgs., (Sep. 26, 2012).

PCT Written Opinion of the International Searching Authority for PCT Application No. PCT/US2011/067218, 3 pgs., (Sep. 26, 2012).

PCT Notification concerning Transmittal of International Preliminary Report on Patentability (Chapter I of the Patent Cooperation Treaty) for PCT Application No. PCT/US2011/067218, 5 pgs., (Jul. 3, 2014).

* cited by examiner

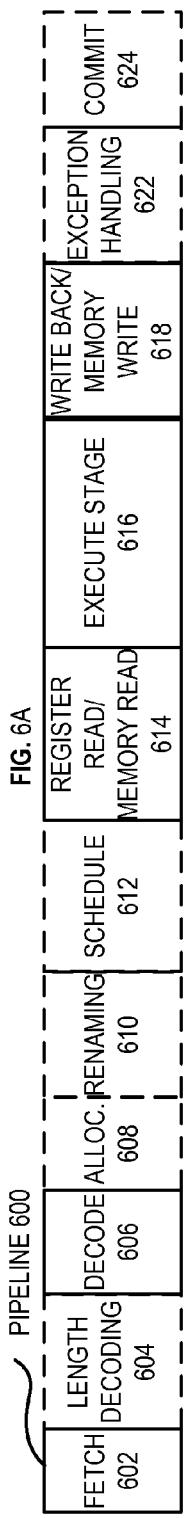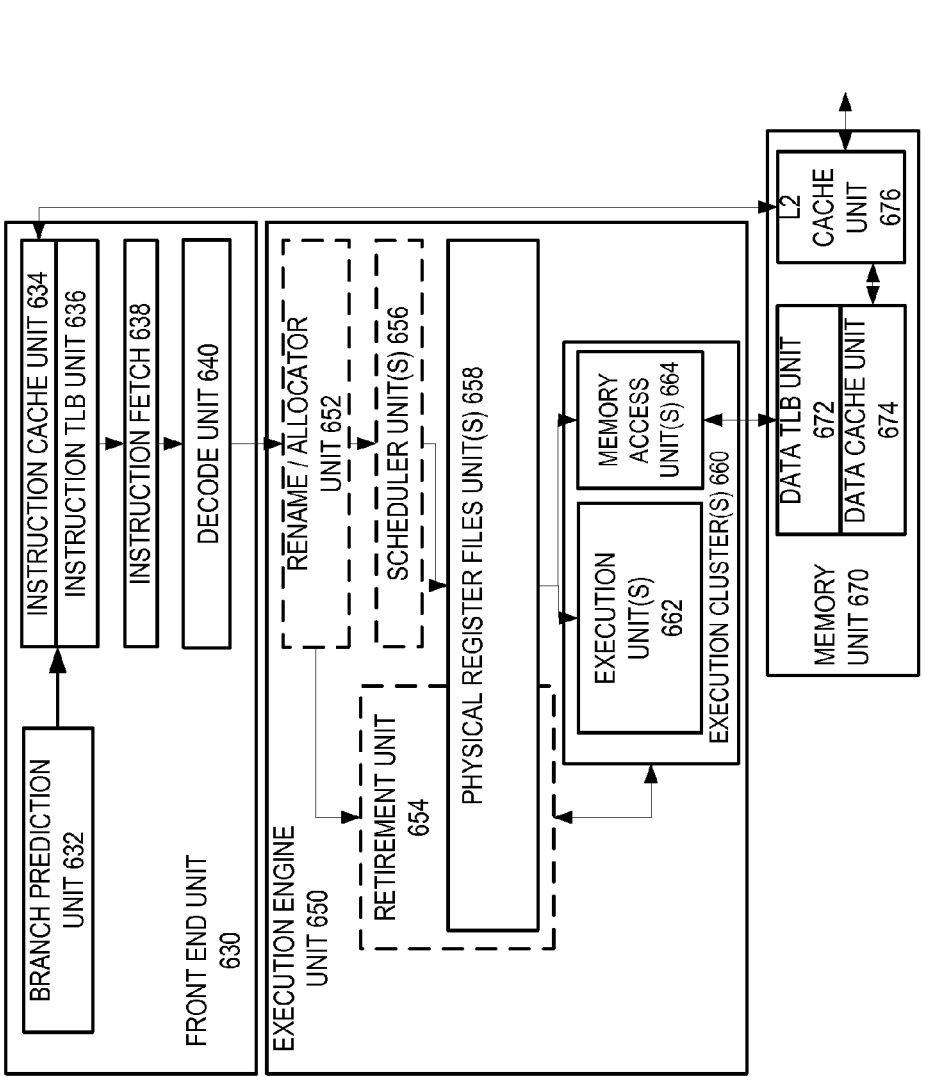
FIG. 6A
FIG. 6B

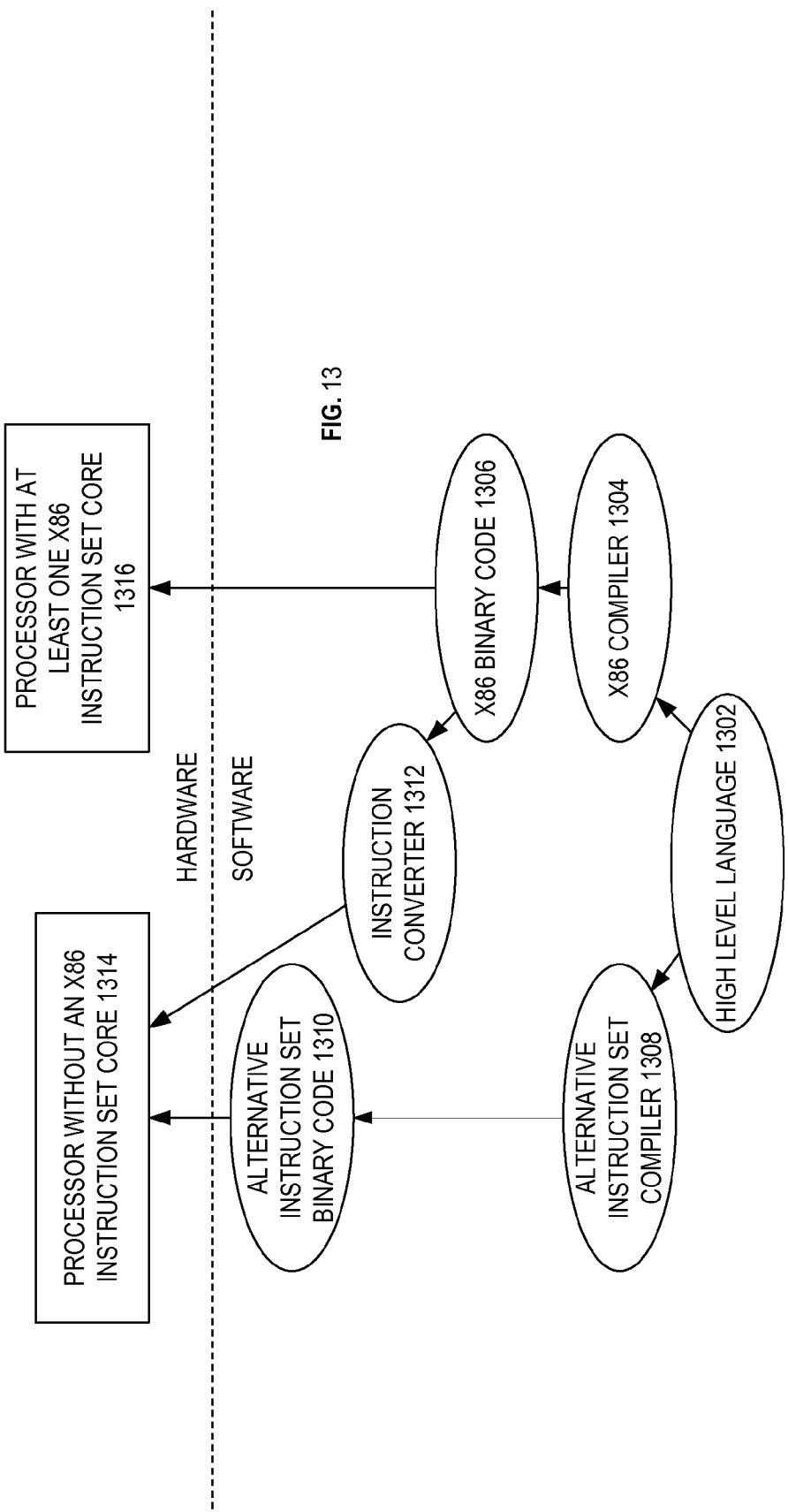

PAGE MISS HANDLER INCLUDING WEAR LEVELING LOGIC

CROSS-REFERENCE TO RELATED APPLICATION

This patent application is a U.S. National Phase Application under 35 U.S.C. §371 of International Application No. PCT/US2011/067221, filed Dec. 23, 2011, entitled PAGE MISS HANDLER INCLUDING WEAR LEVELING LOGIC.

FIELD

Embodiments of the invention generally pertain to computing devices and more particularly to page miss handlers including wear leveling logic/modules for memory devices.

BACKGROUND

For memory and storage devices whose memory cells can endure a limited number of write cycles, some cells might fail much earlier than the others due to uneven write traffic to cells by system applications. In this case, a device becomes unusable much sooner than the expected device lifetime, as expected device lifetimes are determined based on relatively even write usage of the cells. Examples of non-volatile memory devices with limited write endurance include flash memory, phase-change memory (PCM) and magneto-resistive random-access memory (MRAM).

Wear leveling is the approach of (relatively) evenly distributing writes across all device cells, thus extending the device lifetime. Typically it is achieved through dynamically remapping a physical address (i.e., the physical device addresses that would be used in the absence of wear leveling) to a different actual device address.

Wear leveling is particularly important and challenging for memory devices that operate as the memory of a computer system. Because the memory is relatively closer to the processor, ideal wear leveling processes are robust and efficient to handle high write traffic. They also have low performance cost and minimal write overhead. In addition, it is important for wear leveling processes to be highly secure against malicious attacks that compromise the security of the host system.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 6A is a block diagram illustrating both an exemplary in-order pipeline and an exemplary register renaming, out-of-order issue/execution pipeline according to embodiments of the invention.

FIG. 6B is a block diagram illustrating both an exemplary embodiment of an in-order architecture core and an exemplary register renaming, out-of-order issue/execution architecture core to be included in a processor according to embodiments of the invention.

FIG. 13 is a block diagram contrasting the use of a software instruction converter to convert binary instructions in a source instruction set to binary instructions in a target instruction set according to embodiments of the invention.

Figure 1:
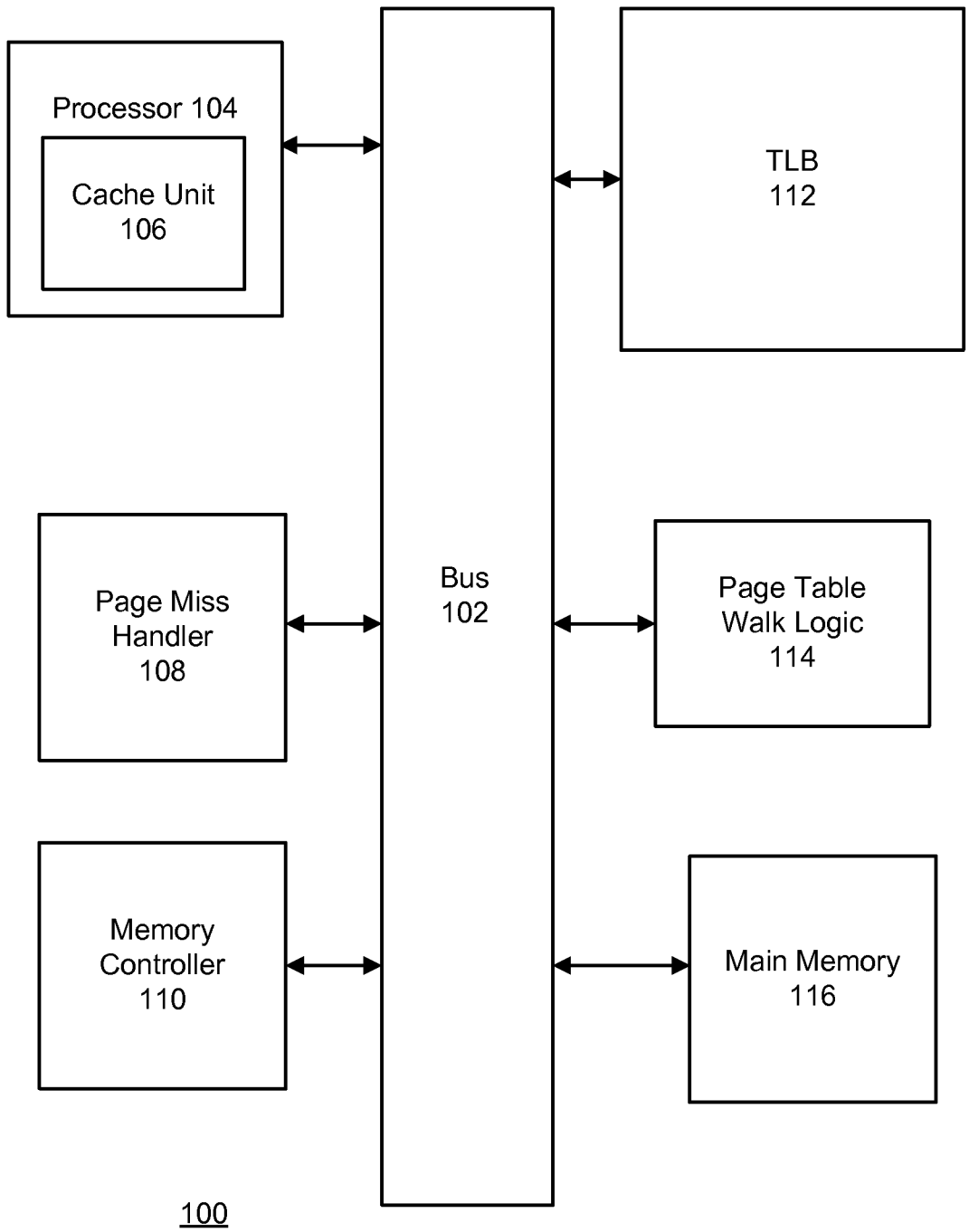
FIG. 1 is an illustration of platform hardware to utilize embodiments of the invention.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of an apparatus, system and method for page miss handlers having wear leveling logic/modules are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

In system memory configurations, virtual addresses are used by system application programs; linear addresses are derived from virtual addresses via segment translation; and physical addresses are calculated from linear addresses through paging. The linear address is used as an index into a page table where a processor locates the corresponding physical address—i.e., a page table is often used to provide a mapping from a linear memory address to a physical memory address in a processor based system.

Page tables are generally memory-resident structures and, therefore, accessing a page table to determine a physical address corresponding to a linear address causes a memory access, which may delay processing time. In order to reduce or eliminate this delay, many processor implementations include a high speed memory or bank of registers within the processor referred to herein as a translation lookaside buffer (TLB), in which some subset of the current linear to physical memory mappings that are in use is cached, based on the values in the page table. This allows a processor to more rapidly access a translation of a linear address to the corresponding physical address than would be possible in general if the processor had to access the page table. Processor implementations generally provide instructions to manage the TLB, including an instruction to invalidate or update all the entries in the TLB based on current translations as stored in the page table.

In use the TLB is initially accessed to determine whether the TLB contains a physical address corresponding to a linear address, identifying a desired memory location. If the linear address is found within the TLB, a "hit" is said to have occurred and the physical address is loaded out of the TLB. If the linear and physical addresses are not cached within the TLB, then a TLB "miss" is said to have occurred. In the event of a miss, a page miss handler (PMH) is used to perform a page table walk to determine the physical address corresponding to the desired linear address.

Embodiments of the invention describe utilizing a wear leveling (WL) address remap engine in the page miss handler described above. Upon a TLB miss, said page miss handler may walk the page table to obtain the required physical address, and once successfully obtained, the handler inquires the WL address remap engine for the actual device address currently mapped to the physical address. The particular mechanism that the engine uses to look up the device address may vary—i.e., a variety of WL algorithms may be used in embodiments of the invention.

FIG. 1 is an illustration of platform hardware to utilize embodiments of the invention. Platform hardware 100 is shown to include bus 102 communicatively coupling several other components to each other, including processor package 104 having cache unit 106, PMH 108, memory controller 110, TLB 112, page table walk logic 114 and main memory 116, which may comprise NAND flash memories, NOR flash memories, Phase Change Memories (PCM), PCM comprised of arrays of phase change memory cells and switches (PCMS), magneto-resistive random-access memory (MRAM), silicon nanowire-based non-volatile memory cells, etc.

Processor 104 may include one or more processing cores to execute computer program instructions for the host system. Cache unit 106 may comprise a single or multi-level cache memory—e.g., a first level (L0) cache memory and a second level (L1) cache memory. Processor 104 generates instructions (alternatively referred to herein as micro-operations or "micro-ops"), such as memory loads, stores, and pre-fetches. The micro-ops may be in a sequence that differs from the sequence in which the instructions appear within a computer program. Micro-ops which involve memory accesses, such as memory loads, stores, and pre-fetches may be managed, at least in part, by memory controller 110.

In this embodiment, TLB 112 maintains a mapping of address translations between linear addresses and corresponding physical and/or device addresses. When a memory access type micro-op is loaded into an execution pipeline, it is intercepted by TLB 112, which performs a lookup to determine whether its internal cache lines contain the physical and/or device address corresponding to the linear address of the micro-op. If the address translation is found therein, i.e., if a hit occurs, TLB 112 re-dispatches a micro-op, updated to include the physical and/or device address. If a miss occurs, TLB 112 notifies PMH 108 that a page walk is to be performed via page table walk logic 114 to determine the physical address corresponding to the linear address of the micro-op.

As described above, wear leveling is achieved through dynamically re-mapping a physical address (i.e., the physical device addresses that would be used in the absence of wear leveling) to a different actual device address based on a wear leveling algorithm. Prior art solutions translate the physical addresses into actual device addresses late at memory controller 110. In embodiments of the invention, actual device address translation occurs right after the page-table-based linear to physical address translation in a manner transparent to the operating system or executive. Thus, embodiments of the invention describe a wear leveling framework that focuses on when and how the actual device address translations required for wear leveling are made available to memory operations, and may implement a variety of wear leveling algorithms (i.e., embodiments of the invention are not limited to a specific wear leveling algorithm).

Embodiments of the invention may implement wear leveling algorithms at PMH 108. Upon a TLB miss, the PMH 108 walks the page table included in page table logic 114 to obtain the required physical address. Once successfully obtained, the PMH utilizes a wear leveling algorithm (i.e., modules or logic executing said wear leveling algorithm may be alternatively referred to herein as a WL address remap engine) for the actual device address currently mapped to the physical address.

Figure 2:
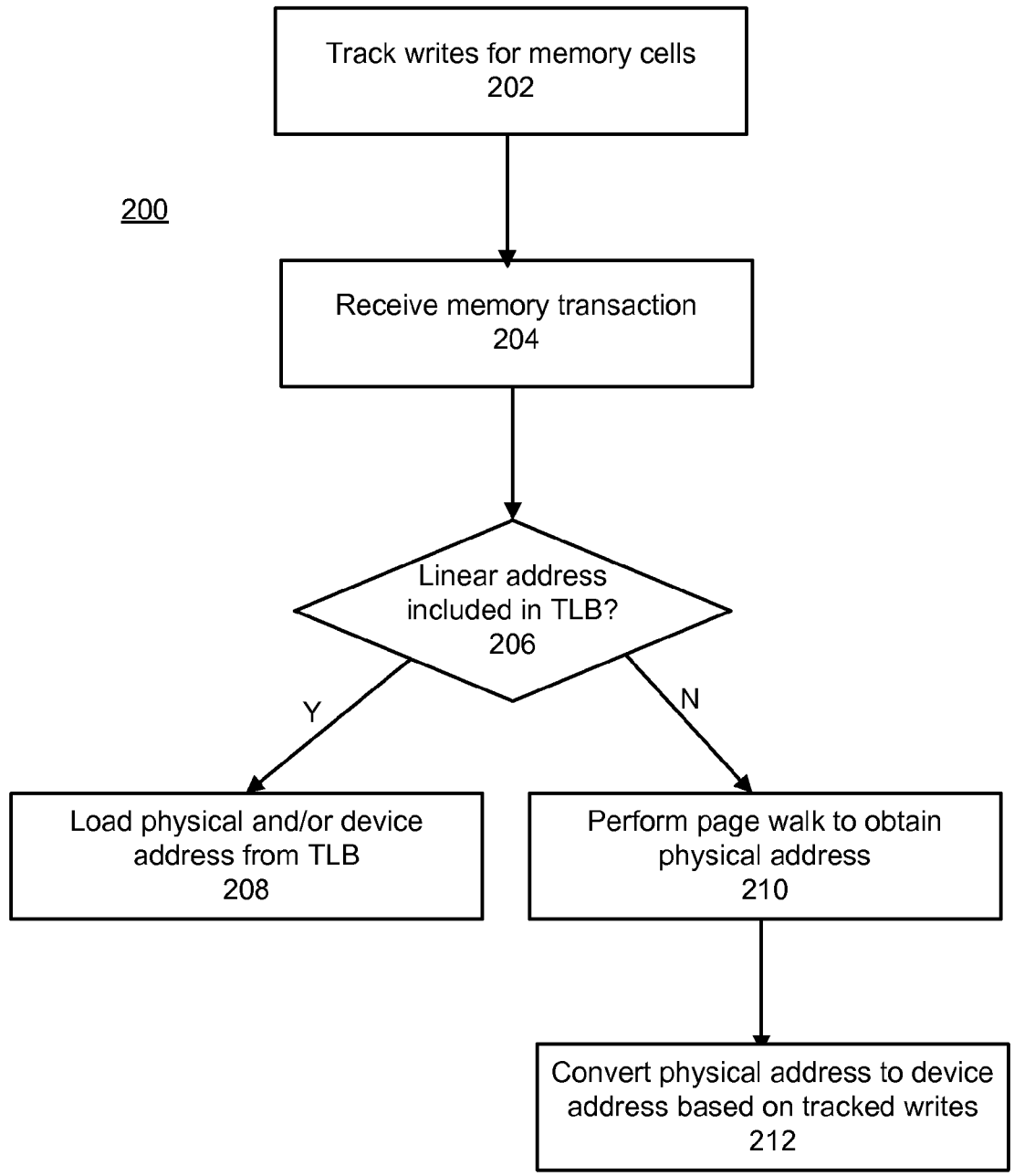
FIG. 2 is a flow diagram of a process according to an embodiment of the invention.

FIG. 2 is a flow diagram of a process according to an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

In process 200, an amount of writes directed towards cells of a memory device are tracked, 202. As described below, writes directed towards cells of a memory device may be tracked at various granularities (e.g., block level, sub-block level). A system write or read transaction is received, 204, and it is determined whether a linear address related to the virtual address of the transaction (i.e., derived from the virtual address via segment translation) is included in a TLB, 206. If it is included, the corresponding physical and/or device address is merely loaded out of the TLB, 208. If it is not included in the TLB, a page table walk is performed to obtain a corresponding physical address, 210. This physical address is converted to a device address for accessing the memory device based on the tracked amount of writes, 212.

Thus, in the above described embodiments, modules and/or logic perform the physical to actual device address translation following the page table-based linear to physical address translation in a manner transparent to the operating system or executive. The above describe process is more efficient compared to prior art solutions, as instead of all memory operations, only those that miss in the TLB incur additional wear leveling address translation overhead. Furthermore, embodiments of the invention do not require OS modifications, thus improving security by not exposing the wear leveling process to the OS or other software.

Figure 3:
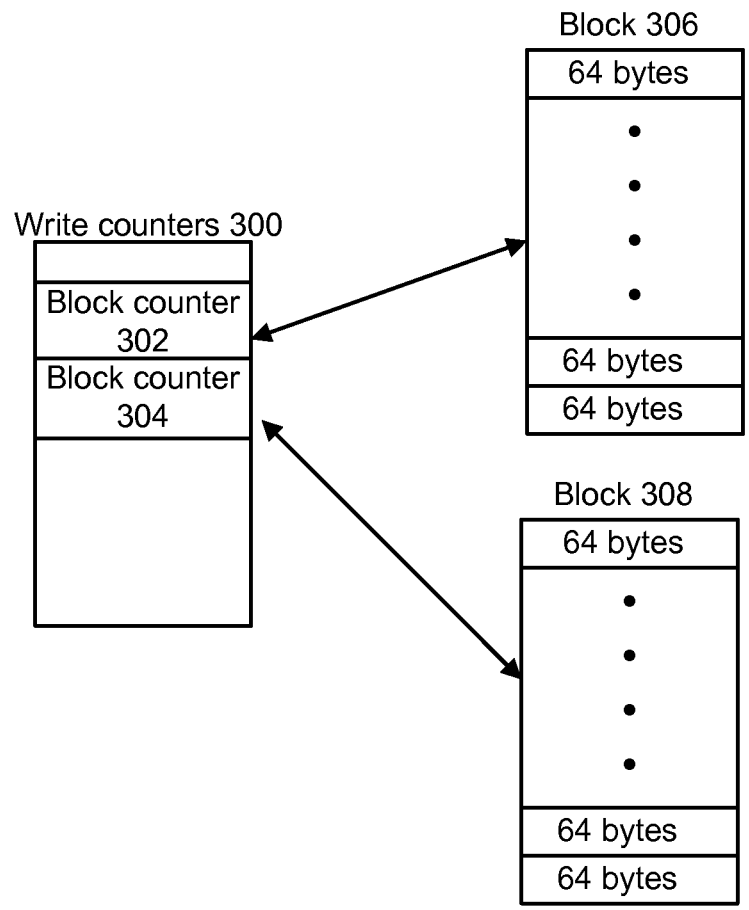
FIG. 3 is an illustration of block counters according to embodiments of the invention.
Figure 3:
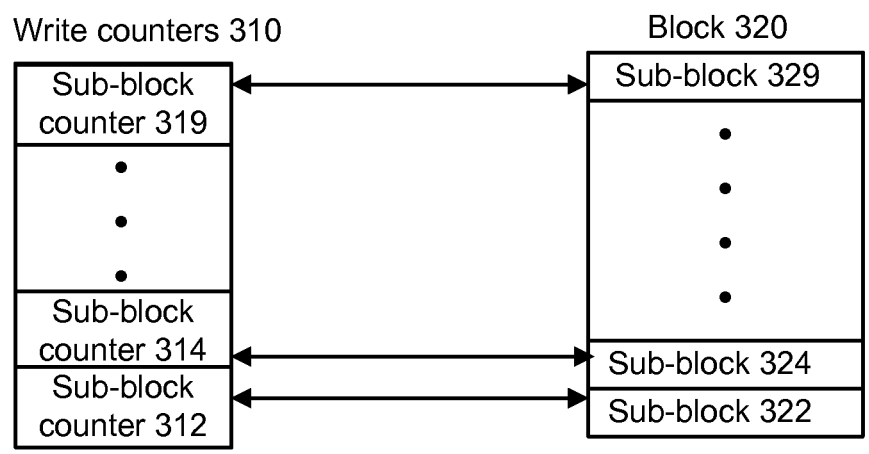

FIG. 3 is an illustration of block counters according to embodiments of the invention. Write counter set 300 is shown to track the number of erase cycles for blocks 306 and 308, via block counters 302 and 304 respectively. In this example, blocks 306 and 308 are 4 k block comprised of 64 byte sub-blocks.

Write counter set 310 is shown to track the number of erase cycles for sub-blocks 322, 324 . . . 329 of block 320 via sub-block counters 312, 314 . . . 329 respectively. In this example, sub-blocks may comprise any size smaller than block 320 (e.g., block 320 may be a 4 k block comprised of 64 byte sub-blocks).

Said counters may trigger a wear leveling process. For example, a memory device address of a block may not be mapped to a physical address if its related block/sub-block counter exceeds a threshold value. Counters that exceed a threshold value may be described as indicating "hot blocks" (or hot sub-blocks). Blocks may be categorized by their write counts, by a level associated with a certain number of write counts (e.g., a different level exists for every one hundred counts of erase), write frequency, or any other type of block classification means associated with wear leveling processes.

Figure 4:
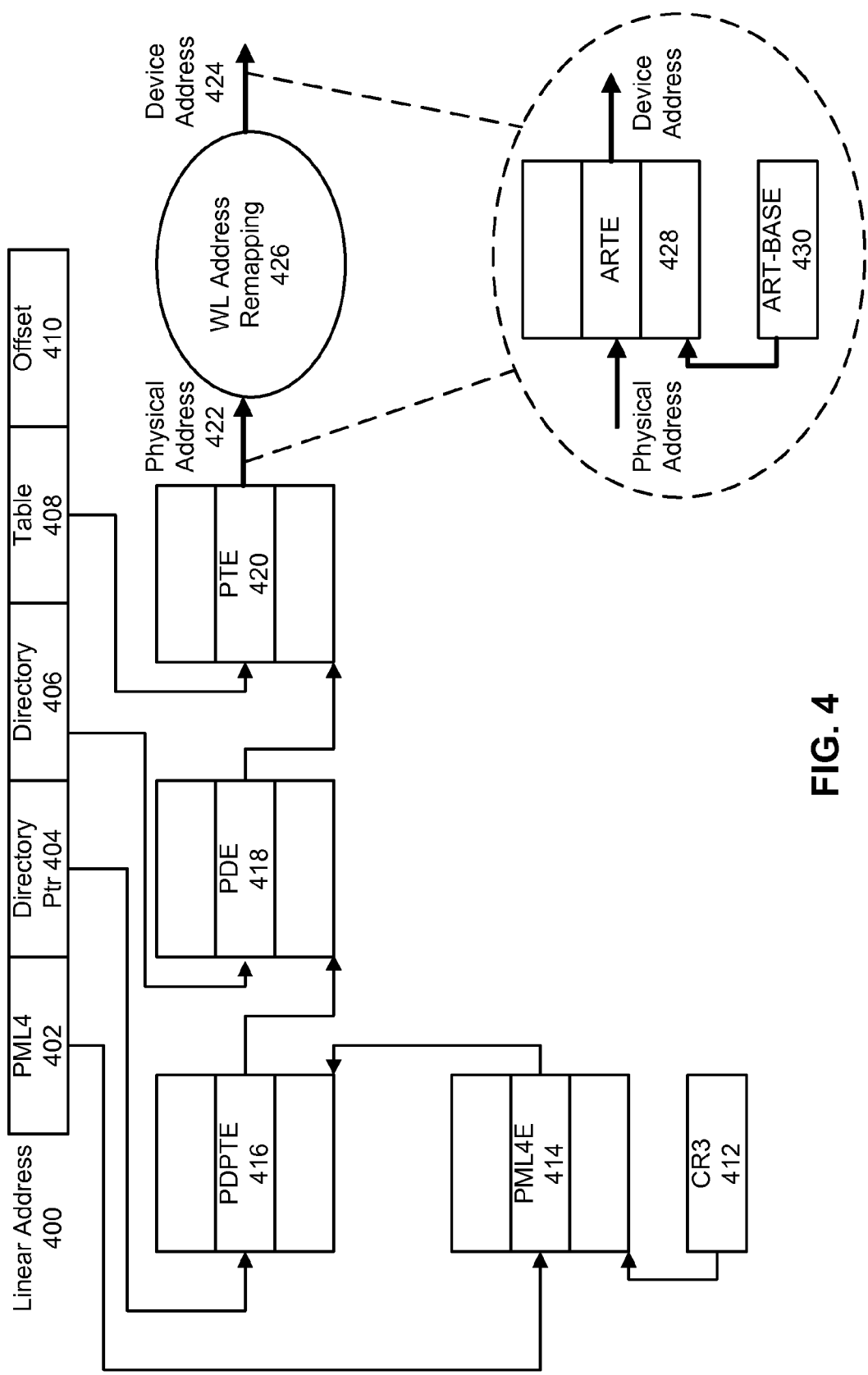
FIG. 4 is a diagram illustrating a linear address translated to a device address according to an embodiment of the invention.

FIG. 4 is a diagram illustrating a linear address translated to a device address according to an embodiment of the invention. In this embodiment, linear address 400 includes a four level hierarchy of data structures accessed by the host processor, shown as segments page map level 4 (PML4) 402, directory pointer 404, directory 406 and table 408. Linear address 400 further includes offset segment 410, which is used as described below.

In this embodiment, register CR3 412 enables the host processor to translate virtual addresses into physical addresses by locating the appropriate page directory and page tables for the respective linear address. In some embodiments, bits of register CR3 412 become the page directory base register (PDBR), which stores the address of the first page directory entry. The most significant bits of the linear address index point to PML4 Entry (PML4E) 414. Said PML4E specifies the address of a Page Directory Pointer Table (PDPT).

The next most significant bits of the linear address index into this PDPT, and point to PDPT Entry (PDPTE) 416. The other levels of the hierarchy—i.e., Page Directory Entry (PDE) 418 and Page Table Entry (PTE) 420, are accessed in a similar fashion. The remaining least significant bits of the linear address give an offset into the memory page referenced by PTE 420.

In this embodiment, translation of physical address 422 to device address 424 is executed via WL address remapping engine 426 to achieve wear leveling for the system memory. In this example, said translation is executed via Address Remap Table (ART) 428, which may be implemented as a separate hardware structure or in software allocated in the memory itself (as shown here, with ART-Base 430 identifying the location of the table). Other embodiments may execute translation formulas dependent on an implemented wear leveling algorithm.

In one embodiment, WL address remapping engine 426 may employ caching structures to speed the translation process. The initial physical to device address mappings may be known or pre-initialized before needed.

Because WL address remapping engine 426 outputs the actual device address at the end of a page miss handling process, this address is used to fill TLB structures and memory device access caches. When a memory operation hits in the TLB, it directly uses the device address stored in the TLB entry. Said WL address remapping engine may map physical addresses to certain device addresses based on write counts for blocks and sub-blocks (e.g., as discussed in FIG. 3); the block granularity used by the TLB to maintain the address translation is considered for each embodiment. For example, in the case of sub-block wear leveling (e.g., shuffling sub-blocks within a 4 KB block), the TLB entries may contain auxiliary information depending on the wear leveling algorithm to correctly translate the sub-block addresses.

Wear leveling algorithms typically change the physical to device address translations dynamically during run-time to achieve efficient wear leveling. Because WL address remap engine 426 does not see the write operations to the memory device, the memory device controller may inform the engine about a new address remap request for wear leveling. For example, the memory controller can signal a new request periodically every N writes, or once it detects a hot block, depending on the particular wear leveling algorithm employed. The memory controller can queue the request in a hardware or software queue that is available to the engine.

The engine may subsequently perform the required datablock movements and update the address mappings and wear leveling related state; however in some embodiments, to ensure correct operation across the system which may comprise one or more processors, the engine performs these actions after all outstanding requests that use the old address translation are completed and all cached information that use the old address mappings, such as the corresponding TLB entries and cache lines in the memory hierarchy, are invalidated. In these embodiments, a shoot-down process is utilized to lightly interrupt all processors (possibly without stalling them or saving the state) to invalidate related TLB entries and cache lines and wait for all outstanding operations on the specific addresses to complete. Once the shoot-down process is completed, the responsible engine can proceed with the aforementioned actions for the address remap. In addition, a shared lock (global or per address) can be used to block new address translations attempt to use a physical address whose mapping is currently being updated by one of the processors. Thus, the block is locked before shoot-down and unlocked after completing the remap actions.

Figure 5:
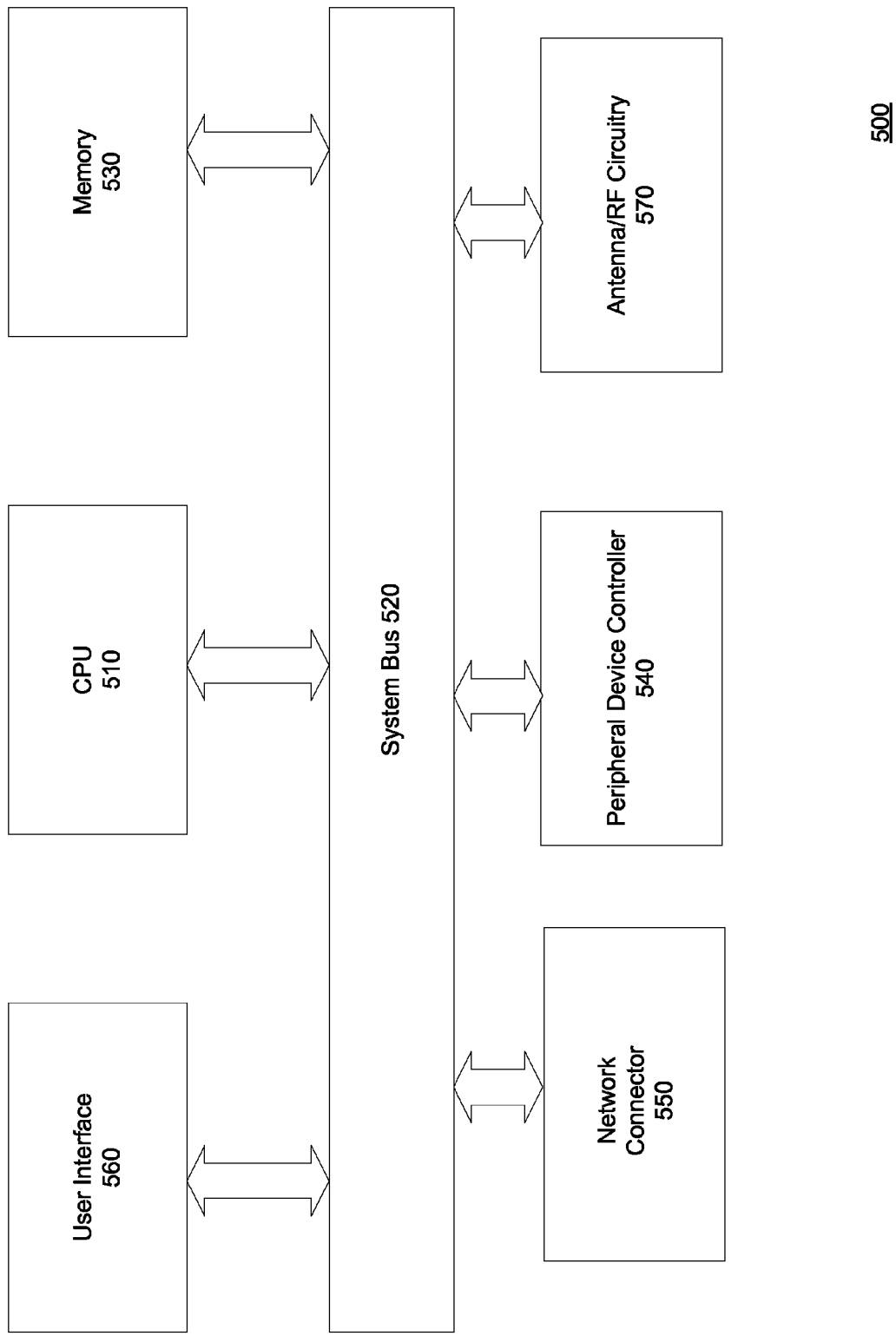
FIG. 5 is block diagram of a system to utilize an embodiment of the invention.

FIG. 5 is a block diagram of a system to utilize an embodiment of the invention. System 500 may describe a server platform, or may be included in, for example, a desktop computer, a laptop computer, a tablet computer, a netbook, a notebook computer, a personal digital assistant (PDA), a server, a workstation, a cellular telephone, a mobile computing device, an Internet appliance, an MP3 or media player or any other type of computing device.

System 500 may include processor 510 to exchange data, via system bus 520, with user interface 560, system memory 530, peripheral device controller 540 and network connector 550. Said system memory may include NAND flash memories, NOR flash memories, PCM, PCMS, MRAM and silicon nanowire-based non-volatile memory cells, and may implement wear leveling logic/modules according to any of the embodiments of the invention described above.

System 500 may further include antenna and RF circuitry 570 to send and receive signals to be processed by the various elements of system 500. The above described antenna may be a directional antenna or an omni-directional antenna. As used herein, the term omni-directional antenna refers to any antenna having a substantially uniform pattern in at least one plane. For example, in some embodiments, said antenna may be an omni-directional antenna such as a dipole antenna, or a quarter wave antenna. Also for example, in some embodiments, said antenna may be a directional antenna such as a parabolic dish antenna, a patch antenna, or a Yagi antenna. In some embodiments, system 500 may include multiple physical antennas.

While shown to be separate from network connector 550, it is to be understood that in other embodiments, antenna and RF circuitry 570 may comprise a wireless interface to operate in accordance with, but not limited to, the IEEE 802.11 standard and its related family, Home Plug AV (HPAV), Ultra Wide Band (UWB), Bluetooth, WiMax, or any other form of wireless communication protocol. In other embodiments, RF circuitry 570 may comprise cellular network connectivity logic or modules provided by wireless carriers, such as provided via GSM (global system for mobile communications) or variations or derivatives, CDMA (code division multiple access) or variations or derivatives, TDM (time division multiplexing) or variations or derivatives, or other cellular service standards.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 6A is a block diagram illustrating both an exemplary in-order pipeline and an exemplary register renaming, out-of-order issue/execution pipeline according to embodiments of the invention. FIG. 6B is a block diagram illustrating both an exemplary embodiment of an in-order architecture core and an exemplary register renaming, out-of-order issue/execution architecture core to be included in a processor according to embodiments of the invention. The solid lined boxes in FIGS. 6A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 6A, a processor pipeline 600 includes a fetch stage 602, a length decode stage 604, a decode stage 606, an allocation stage 608, a renaming stage 610, a scheduling (also known as a dispatch or issue) stage 612, a register read/memory read stage 614, an execute stage 616, a write back/memory write stage 618, an exception handling stage 622, and a commit stage 624.

FIG. 6B shows processor core 690 including a front end unit 630 coupled to an execution engine unit 650, and both are coupled to a memory unit 670. The core 690 may be a reduced instruction set computing (RISC) core, a complex instruction set computing (CISC) core, a very long instruction word (VLIW) core, or a hybrid or alternative core type. As yet another option, the core 690 may be a special-purpose core, such as, for example, a network or communication core, compression engine, coprocessor core, general purpose computing graphics processing unit (GPGPU) core, graphics core, or the like.

The front end unit 630 includes a branch prediction unit 632 coupled to an instruction cache unit 634, which is coupled to an instruction translation lookaside buffer (TLB) 636, which is coupled to an instruction fetch unit 638, which is coupled to a decode unit 640. The decode unit 640 (or decoder) may decode instructions, and generate as an output one or more micro-operations, micro-code entry points, microinstructions, other instructions, or other control signals, which are decoded from, or which otherwise reflect, or are derived from, the original instructions. The decode unit 640 may be implemented using various different mechanisms. Examples of suitable mechanisms include, but are not limited to, lookup tables, hardware implementations, programmable logic arrays (PLAs), microcode read only memories (ROMs), etc. In one embodiment, the core 690 includes a microcode ROM or other medium that stores microcode for certain macroinstructions (e.g., in decode unit 640 or otherwise within the front end unit 630). The decode unit 640 is coupled to a rename/allocator unit 652 in the execution engine unit 650.

The execution engine unit 650 includes the rename/allocator unit 652 coupled to a retirement unit 654 and a set of one or more scheduler unit(s) 656. The scheduler unit(s) 656 represents any number of different schedulers, including reservations stations, central instruction window, etc. The scheduler unit(s) 656 is coupled to the physical register file(s) unit(s) 658. Each of the physical register file(s) units 658 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 658 comprises a vector registers unit, a write mask registers unit, and a scalar registers unit. These register units may provide architectural vector registers, vector mask registers, and general purpose registers. The physical register file(s) unit(s) 658 is overlapped by the retirement unit 654 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 654 and the physical register file(s) unit(s) 658 are coupled to the execution cluster(s) 660. The execution cluster(s) 660 includes a set of one or more execution units 662 and a set of one or more memory access units 664. The execution units 662 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 656, physical register file(s) unit(s) 658, and execution cluster(s) 660 are shown as being possibly plural because certain embodiments create separate pipelines for certain types of data/operations (e.g., a scalar integer pipeline, a scalar floating point/packed integer/packed floating point/vector integer/ vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 664). It should also be understood that where separate pipelines are used, one or more of these pipelines may be out-of-order issue/execution and the rest in-order.

The set of memory access units 664 is coupled to the memory unit 670, which includes a data TLB unit 672 coupled to a data cache unit 674 coupled to a level 2 (L2) cache unit 676. In one exemplary embodiment, the memory access units 664 may include a load unit, a store address unit, and a store data unit, each of which is coupled to the data TLB unit 672 in the memory unit 670. The instruction cache unit 634 is further coupled to a level 2 (L2) cache unit 676 in the memory unit 670. The L2 cache unit 676 is coupled to one or more other levels of cache and eventually to a main memory.

By way of example, the exemplary register renaming, out-of-order issue/execution core architecture may implement the pipeline 600 as follows: 1) the instruction fetch 638 performs the fetch and length decoding stages 602 and 604; 2) the decode unit 640 performs the decode stage 606; 3) the rename/allocator unit 652 performs the allocation stage 608 and renaming stage 610; 4) the scheduler unit(s) 656 performs the schedule stage 612; 5) the physical register file(s) unit(s) 658 and the memory unit 670 perform the register read/memory read stage 614; the execution cluster 660 perform the execute stage 616; 6) the memory unit 670 and the physical register file(s) unit(s) 658 perform the write back/memory write stage 618; 7) various units may be involved in the exception handling stage 622; and 8) the retirement unit 654 and the physical register file(s) unit(s) 658 perform the commit stage 624.

The core 690 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 690 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 634/674 and a shared L2 cache unit 676, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 7B:
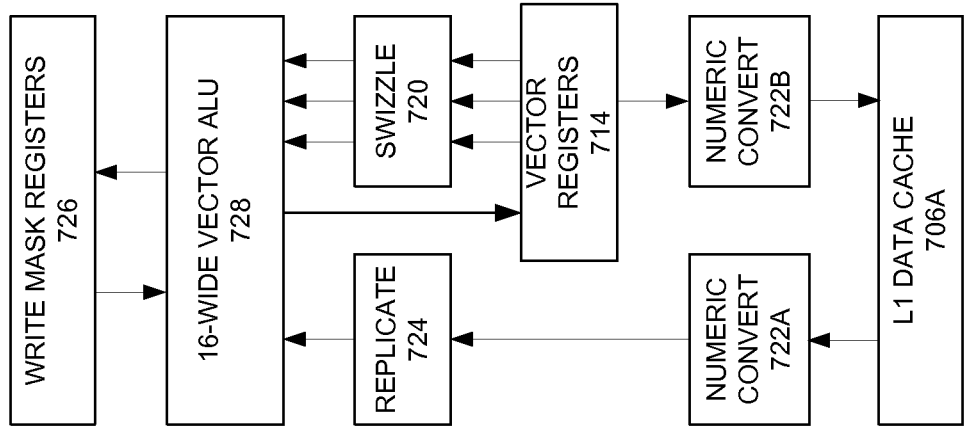
FIGS. 7A-B illustrate a block diagram of a more specific exemplary in-order core architecture, which core would be one of several logic blocks (including other cores of the same type and/or different types) in a chip.
Figure 7A:
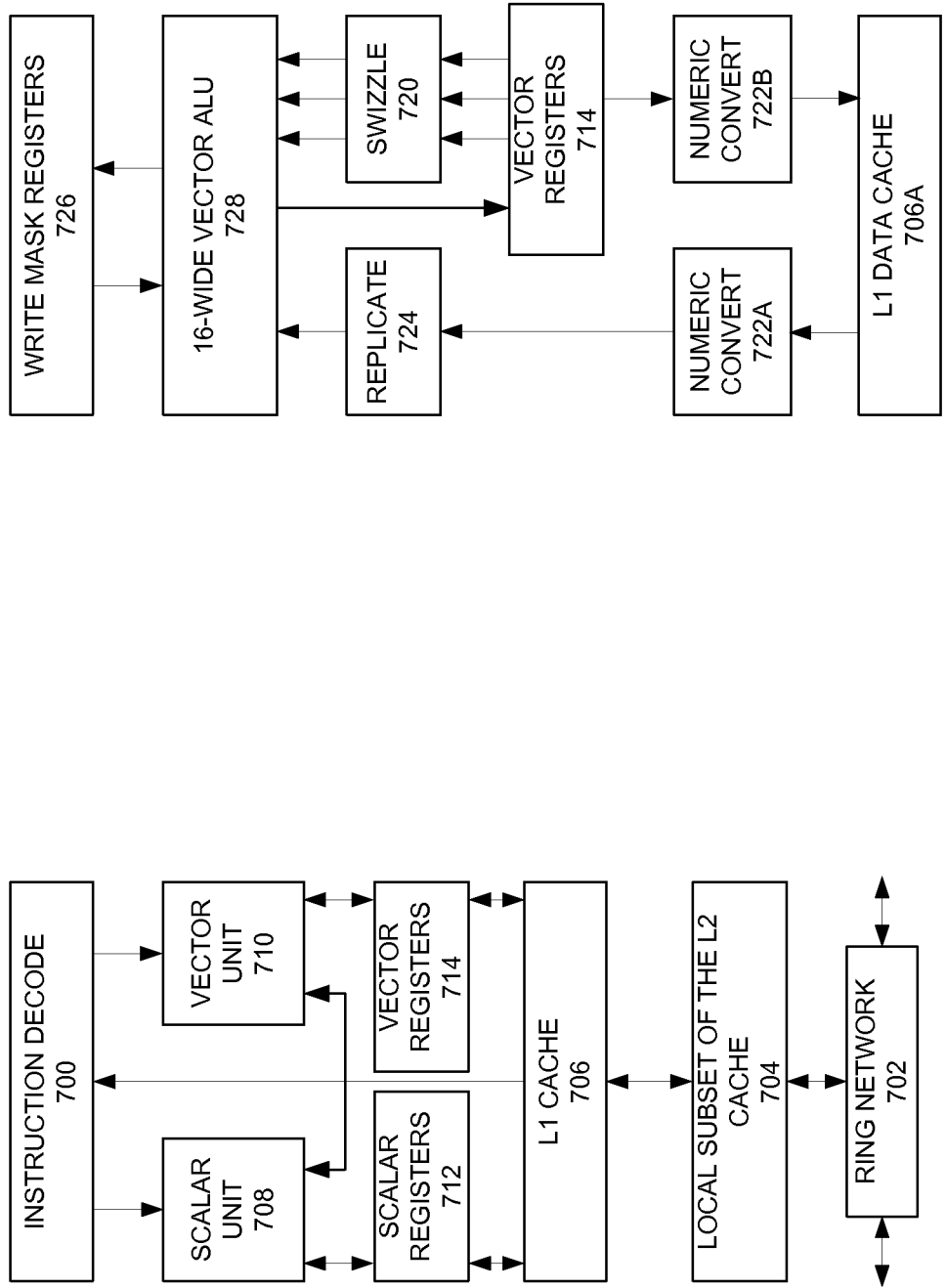

FIGS. 7A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 7A is a block diagram of a single processor core, along with its connection to the on-die interconnect network 702 and with its local subset of the Level 2 (L2) cache 704, according to embodiments of the invention. In one embodiment, an instruction decoder 700 supports the x86 instruction set with a packed data instruction set extension. An L1 cache 706 allows low-latency accesses to cache memory into the scalar and vector units. While in one embodiment (to simplify the design), a scalar unit 708 and a vector unit 710 use separate register sets (respectively, scalar registers 712 and vector registers 714) and data transferred between them is written to memory and then read back in from a level 1 (L1) cache 706, alternative embodiments of the invention may use a different approach (e.g., use a single register set or include a communication path that allow data to be transferred between the two register files without being written and read back).

The local subset of the L2 cache 704 is part of a global L2 cache that is divided into separate local subsets, one per processor core. Each processor core has a direct access path to its own local subset of the L2 cache 704. Data read by a processor core is stored in its L2 cache subset 704 and can be accessed quickly, in parallel with other processor cores accessing their own local L2 cache subsets. Data written by a processor core is stored in its own L2 cache subset 704 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 7B is an expanded view of part of the processor core in FIG. 7A according to embodiments of the invention. FIG. 7B includes an L1 data cache 706A part of the L1 cache 704, as well as more detail regarding the vector unit 710 and the vector registers 714. Specifically, the vector unit 710 is a 16-wide vector processing unit (VPU) (see the 16-wide ALU 728), which executes one or more of integer, single-precision float, and double-precision float instructions. The VPU supports swizzling the register inputs with swizzle unit 720, numeric conversion with numeric convert units 722A-B, and replication with replication unit 724 on the memory input. Write mask registers 726 allow predicating resulting vector writes.

Figure 8:
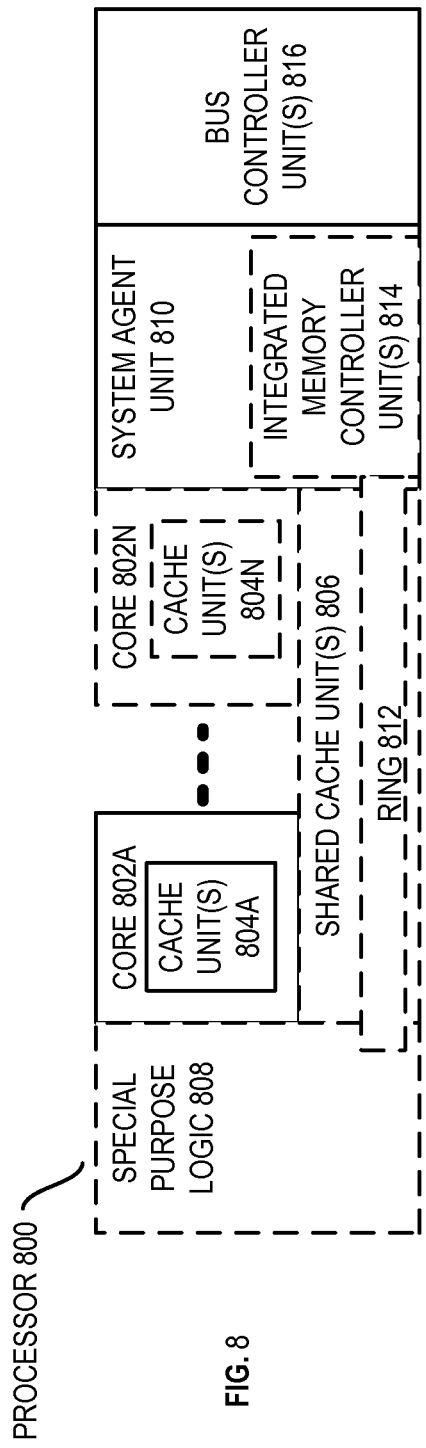
FIG. 8 is a block diagram of a processor 800 that may have more than one core, may have an integrated memory controller, and may have integrated graphics according to embodiments of the invention.

FIG. 8 is a block diagram of a processor 800 that may have more than one core, may have an integrated memory controller, and may have integrated graphics according to embodiments of the invention. The solid lined boxes in FIG. 8 illustrate a processor 800 with a single core 802A, a system agent 810, a set of one or more bus controller units 816, while the optional addition of the dashed lined boxes illustrates an alternative processor 800 with multiple cores 802A-N, a set of one or more integrated memory controller unit(s) 814 in the system agent unit 810, and special purpose logic 808.

Thus, different implementations of the processor 800 may include: 1) a CPU with the special purpose logic 808 being integrated graphics and/or scientific (throughput) logic (which may include one or more cores), and the cores 802A-N being one or more general purpose cores (e.g., general purpose in-order cores, general purpose out-of-order cores, a combination of the two); 2) a coprocessor with the cores 802A-N being a large number of special purpose cores intended primarily for graphics and/or scientific (throughput); and 3) a coprocessor with the cores 802A-N being a large number of general purpose in-order cores. Thus, the processor 800 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 800 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 806, and external memory (not shown) coupled to the set of integrated memory controller units 814. The set of shared cache units 806 may include one or more mid-level caches, such as level 2 (L2), level 3 (L3), level 4 (L4), or other levels of cache, a last level cache (LLC), and/or combinations thereof. While in one embodiment a ring based interconnect unit 812 interconnects the integrated graphics logic 808, the set of shared cache units 806, and the system agent unit 810/integrated memory controller unit(s) 814, alternative embodiments may use any number of well-known techniques for interconnecting such units. In one embodiment, coherency is maintained between one or more cache units 806 and cores 802-A-N.

In some embodiments, one or more of the cores 802A-N are capable of multi-threading. The system agent 810 includes those components coordinating and operating cores 802A-N. The system agent unit 810 may include for example a power control unit (PCU) and a display unit. The PCU may be or include logic and components needed for regulating the power state of the cores 802A-N and the integrated graphics logic 808. The display unit is for driving one or more externally connected displays.

The cores 802A-N may be homogenous or heterogeneous in terms of architecture instruction set; that is, two or more of the cores 802A-N may be capable of execution the same instruction set, while others may be capable of executing only a subset of that instruction set or a different instruction set.

FIGS. 9-12 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 9:
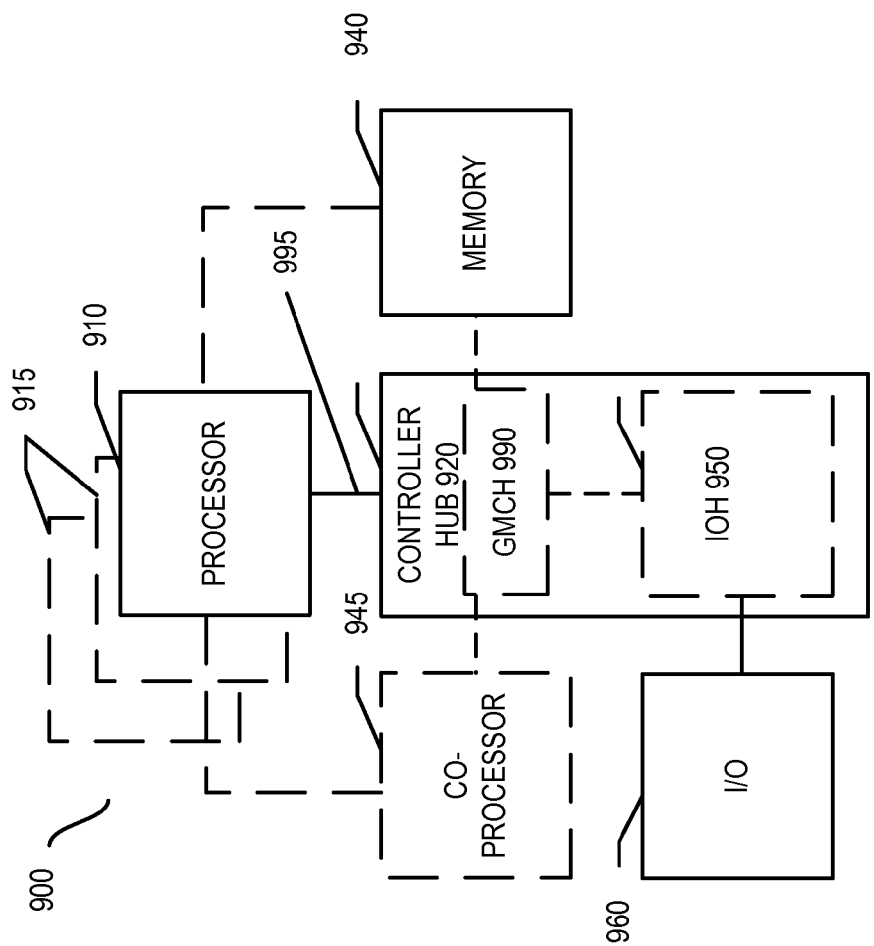
FIG. 9 is a block diagram of an exemplary computer architecture according to an embodiment of the invention.

Referring now to FIG. 9, shown is a block diagram of a system 900 in accordance with one embodiment of the present invention. The system 900 may include one or more processors 910, 915, which are coupled to a controller hub 920. In one embodiment the controller hub 920 includes a graphics memory controller hub (GMCH) 990 and an Input/Output Hub (IOH) 950 (which may be on separate chips); the GMCH 990 includes memory and graphics controllers to which are coupled memory 940 and a coprocessor 945; the IOH 950 is couples input/output (I/O) devices 960 to the GMCH 990. Alternatively, one or both of the memory and graphics controllers are integrated within the processor (as described herein), the memory 940 and the coprocessor 945 are coupled directly to the processor 910, and the controller hub 920 in a single chip with the IOH 950.

The optional nature of additional processors 915 is denoted in FIG. 9 with broken lines. Each processor 910, 915 may include one or more of the processing cores described herein and may be some version of the processor 800.

The memory 940 may be, for example, dynamic random access memory (DRAM), phase change memory (PCM), or a combination of the two. For at least one embodiment, the controller hub 920 communicates with the processor(s) 910, 915 via a multi-drop bus, such as a frontside bus (FSB), point-to-point interface such as QuickPath Interconnect (QPI), or similar connection 995.

In one embodiment, the coprocessor 945 is a special-purpose processor, such as, for example, a high-throughput MIC processor, a network or communication processor, compression engine, graphics processor, GPGPU, embedded processor, or the like. In one embodiment, controller hub 920 may include an integrated graphics accelerator.

There can be a variety of differences between the physical resources 910, 915 in terms of a spectrum of metrics of merit including architectural, microarchitectural, thermal, power consumption characteristics, and the like.

In one embodiment, the processor 910 executes instructions that control data processing operations of a general type. Embedded within the instructions may be coprocessor instructions. The processor 910 recognizes these coprocessor instructions as being of a type that should be executed by the attached coprocessor 945. Accordingly, the processor 910 issues these coprocessor instructions (or control signals representing coprocessor instructions) on a coprocessor bus or other interconnect, to coprocessor 945. Coprocessor(s) 945 accept and execute the received coprocessor instructions.

Figure 10:
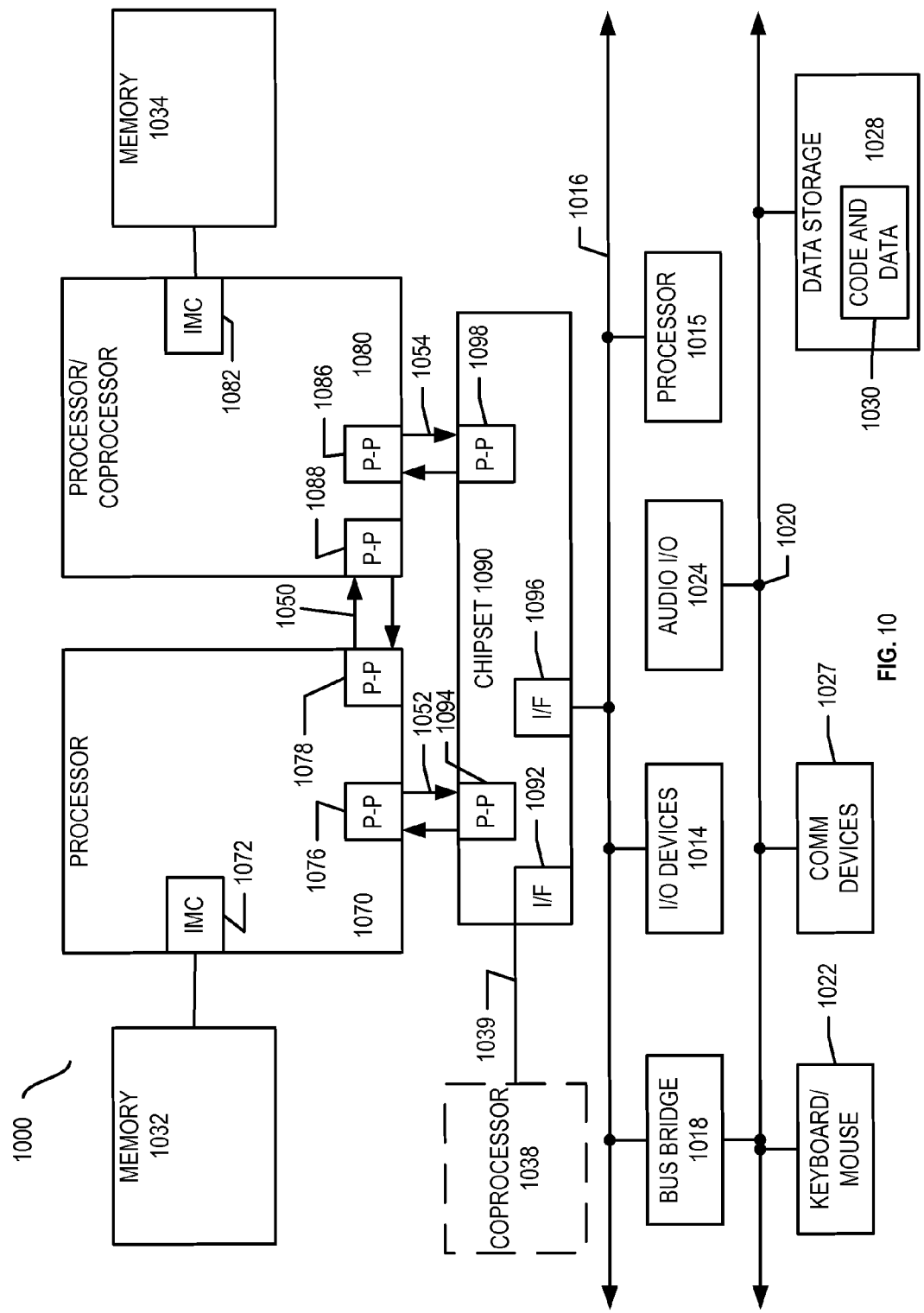
FIG. 10 is a block diagram of an exemplary computer architecture according to an embodiment of the invention.

Referring now to FIG. 10, shown is a block diagram of a first more specific exemplary system 1000 in accordance with an embodiment of the present invention. As shown in FIG. 10, multiprocessor system 1000 is a point-to-point interconnect system, and includes a first processor 1070 and a second processor 1080 coupled via a point-to-point interconnect 1050. Each of processors 1070 and 1080 may be some version of the processor 800. In one embodiment of the invention, processors 1070 and 1080 are respectively processors 910 and 915, while coprocessor 1038 is coprocessor 945. In another embodiment, processors 1070 and 1080 are respectively processor 910 coprocessor 945.

Processors 1070 and 1080 are shown including integrated memory controller (IMC) units 1072 and 1082, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 may each exchange information with a chipset 1090 via individual P-P interfaces 1052, 1054 using point to point interface circuits 1076, 1094, 1086, 1098. Chipset 1090 may optionally exchange information with the coprocessor 1038 via a high-performance interface 1039. In one embodiment, the coprocessor 1038 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present invention is not so limited.

As shown in FIG. 10, various I/O devices 1014 may be coupled to first bus 1016, along with a bus bridge 1018 which couples first bus 1016 to a second bus 1020. In one embodiment, one or more additional processor(s) 1015, such as coprocessors, high-throughput MIC processors, GPGPU's, accelerators (such as, e.g., graphics accelerators or digital signal processing (DSP) units), field programmable gate arrays, or any other processor, are coupled to first bus 1016. In one embodiment, second bus 1020 may be a low pin count (LPC) bus. Various devices may be coupled to a second bus 1020 including, for example, a keyboard and/or mouse 1022, communication devices 1027 and a storage unit 1028 such as a disk drive or other mass storage device which may include instructions/code and data 1030, in one embodiment. Further, an audio I/O 1024 may be coupled to the second bus 1020. Note that other architectures are possible. For example, instead of the point-to-point architecture of FIG. 10, a system may implement a multi-drop bus or other such architecture.

Figure 11:
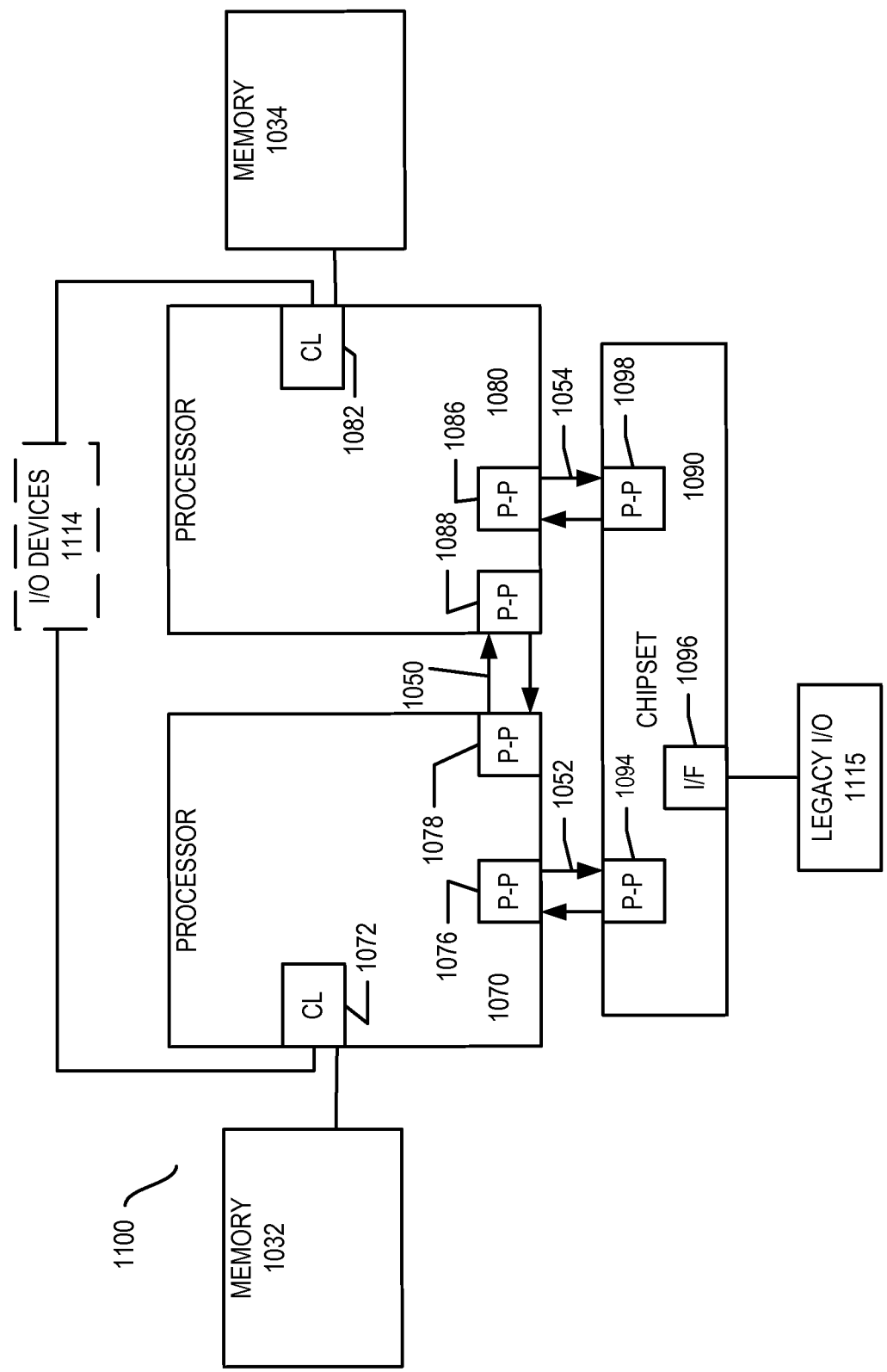
FIG. 11 is a block diagram of an exemplary computer architecture according to an embodiment of the invention.

Referring now to FIG. 11, shown is a block diagram of a second more specific exemplary system 1100 in accordance with an embodiment of the present invention. Like elements in FIGS. 10 and 11 bear like reference numerals, and certain aspects of FIG. 10 have been omitted from FIG. 11 in order to avoid obscuring other aspects of FIG. 11.

FIG. 11 illustrates that the processors 1070, 1080 may include integrated memory and I/O control logic ("CL") 1072 and 1082, respectively. Thus, the CL 1072, 1082 include integrated memory controller units and include I/O control logic. FIG. 11 illustrates that not only are the memories 1032, 1034 coupled to the CL 1072, 1082, but also that I/O devices 1114 are also coupled to the control logic 1072, 1082. Legacy I/O devices 1115 are coupled to the chipset 1090.

Figure 12:
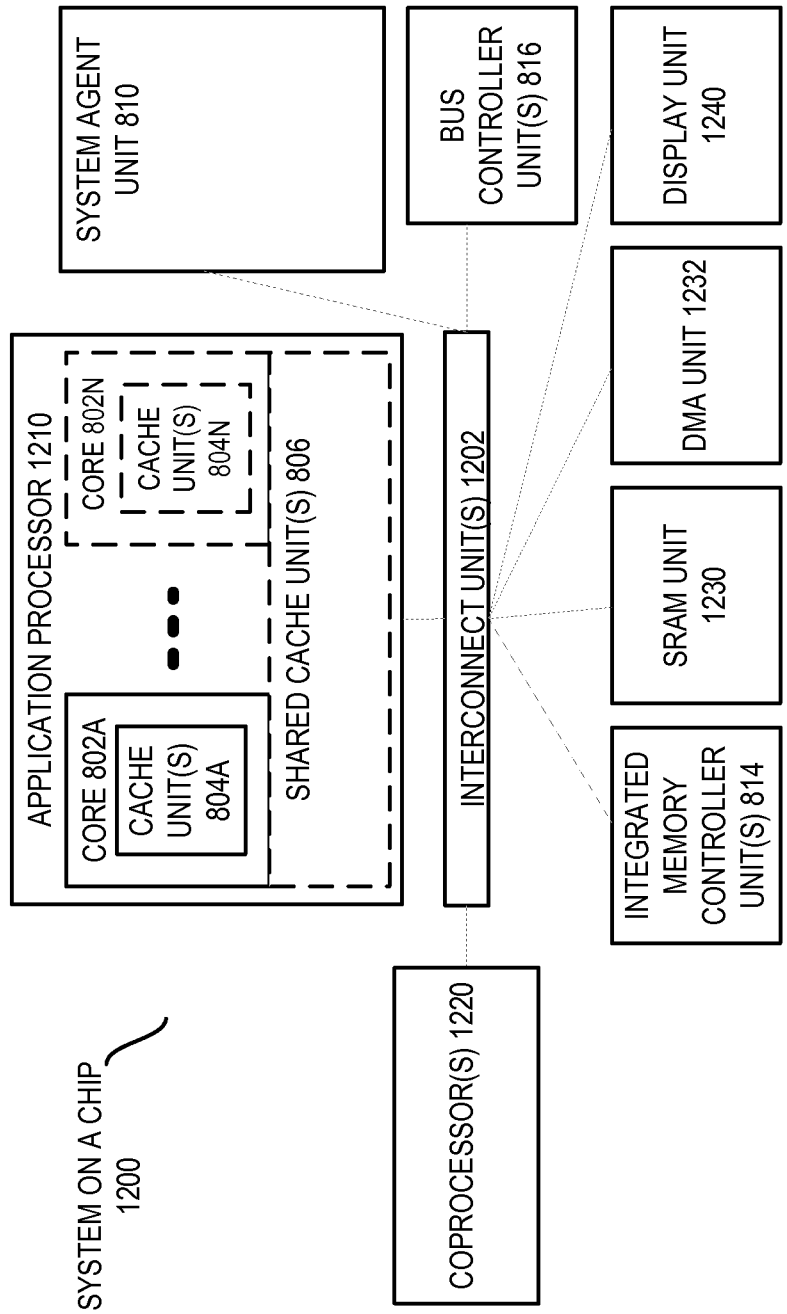
FIG. 12 is a block diagram of an exemplary computer architecture according to an embodiment of the invention.

Referring now to FIG. 12, shown is a block diagram of a SoC 1200 in accordance with an embodiment of the present invention. Similar elements in FIG. 8 bear like reference numerals. Also, dashed lined boxes are optional features on more advanced SoCs. In FIG. 12, an interconnect unit(s) 1202 is coupled to: an application processor 1210 which includes a set of one or more cores 202A-N and shared cache unit(s) 806; a system agent unit 810; a bus controller unit(s) 816; an integrated memory controller unit(s) 814; a set or one or more coprocessors 1220 which may include integrated graphics logic, an image processor, an audio processor, and a video processor; an static random access memory (SRAM) unit 1230; a direct memory access (DMA) unit 1232; and a display unit 1240 for coupling to one or more external displays. In one embodiment, the coprocessor(s) 1220 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1030 illustrated in FIG. 10, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 13 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1304 represents a compiler that is operable to generate x86 binary code 1306 (e.g., object code) that can, with or without additional linkage processing, be executed on the processor with at least one x86 instruction set core 1316. Similarly, FIG. 13 shows the program in the high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1312 is used to convert the x86 binary code 1306 into code that may be natively executed by the processor without an x86 instruction set core 1314. This converted code is not likely to be the same as the alternative instruction set binary code 1310 because an instruction converter capable of this is difficult to make; however, the converted code will accomplish the general operation and be made up of instructions from the alternative instruction set. Thus, the instruction converter 1312 represents software, firmware, hardware, or a combination thereof that, through emulation, simulation or any other process, allows a processor or other electronic device that does not have an x86 instruction set processor or core to execute the x86 binary code 1306.

Various components referred to above as processes, servers, or tools described herein may be a means for performing the functions described. Each component described herein includes software or hardware, or a combination of these. Each and all components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

A computer readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable non-transitory storage medium may also include a storage or database from which content can be downloaded. Said computer readable medium may also include a device or product having content stored thereon at a time of sale or delivery. Thus, delivering a device with stored content, or offering content for download over a communication medium may be understood as providing an article of manufacture with such content described herein.

What is claimed is:

1. A method comprising:
tracking an amount of writes directed towards cells of a memory device;
determining whether a linear address specified by a system write or read transaction is included in a translation-lookaside buffer (TLB);
in response to determining the linear address is included in the TLB, obtaining a first physical or device address included in the TLB and corresponding to the linear address; and
in response to determining the linear address is not included in the TLB, resulting in a TLB miss, performing a wear leveling operation by:
performing a page table walk to obtain a corresponding second physical address;
converting the second physical address to a device address for accessing the memory device based, at least in part, on the tracked amount of writes; and
storing the converted second physical address and the device address in an entry in an address remapping table (ART).

2. The method of claim 1, wherein converting the second physical address to a device address for accessing the memory device based, at least in part, on the tracked amount of writes comprises determining whether the amount of writes exceeds a threshold value.

3. The processing device of claim 1, wherein based on an identification that the address is not present within the buffer, the cache controller is configured to scan the home tile table to identify a presence of the address within the home tile table.

4. The method of claim 1, further comprising:
in response to determining the linear address is not included in the TLB, resulting in a TLB miss, invalidating data in a cache memory related to the physical address.

5. The method of claim 1, further comprising:
in response to determining the linear address is not included in the TLB, resulting in a TLB miss, setting a value of a lock for notifying system components that the second physical address is being converted to a device address for accessing the memory device.

6. The method of claim 1, wherein the memory device comprises flash memory.

7. The method of claim 1, wherein the memory device comprises phase change memory (PCM).

8. An apparatus comprising:
a plurality of counters to track the amount of writes for cells of a memory device;
a translation-lookaside buffer (TLB) to include linear address to physical or device address translation data;
a page miss handler to, in response to determining a linear address specified by a write or read transaction is not included in the TLB, resulting in a TLB miss, perform a wear leveling operation by
performing a page table walk to obtain a corresponding physical address, and converting the physical address to a device address for accessing the memory device based, at least in part, on the tracked amount of writes; and an address remapping table (ART) to store the device address corresponding to the physical address in an entry of the ART.

9. The apparatus of claim 8, wherein converting the physical address to a device address for accessing the memory device based, at least in part, on the tracked amount of writes comprises determining whether the amount of writes exceeds a threshold value.

10. The apparatus of claim 8, wherein converting the physical address to a device address for accessing the memory device based, at least in part, on the tracked amount of writes comprises determining whether the amount of writes equals a periodic value.

11. The apparatus of claim 8, the page miss handler to further invalidate data in a cache memory related to the physical address.

12. The apparatus of claim 8, the page miss handler to further set a value of a lock for indicating that the physical address is being converted to a device address for accessing the memory device.

13. The apparatus of claim 8, wherein the memory device comprises flash memory.

14. The apparatus of claim 8, wherein the memory device comprises phase change memory (PCM).

15. A system comprising:
- a processor;
- a data bus; and
- a memory device to exchange data with the processor via the data bus, the memory device; and
- a memory wear leveling module to
  - track an amount of writes directed towards cells of a memory device;
  - determine a linear address specified by a system write or read transaction is not included in a translation-lookaside buffer (TLB), resulting in a TLB miss:
  - perform a wear leveling operation by:
    - performing a page table walk to obtain a corresponding physical address;
    - converting the physical address to a device address for accessing the memory device based, at least in part, on the tracked amount of writes; and
    - storing the converted physical address and the device address in an entry in an address remapping table (ART).

16. The system of claim 15, wherein converting the physical address to a device address for accessing the memory device based, at least in part, on the tracked amount of writes comprises determining whether the amount of writes exceeds a threshold value.

17. The system of claim 15, wherein converting the physical address to a device address for accessing the memory device based, at least in part, on the tracked amount of writes comprises determining whether the amount of writes equals a periodic value.

18. The system of claim 15, the wear leveling module to further:
- invalidate data in a cache memory related to the physical address.

19. The system of claim 15, the wear leveling module to further:
- set a value of a lock for notifying system components that the physical address is being converted to a device address for accessing the memory device.

20. The system of claim 15, wherein the memory device comprises flash memory.

21. The system of claim 15, wherein the memory device comprises phase change memory (PCM).

* * * * *